US012648347B2

(12) United States Patent
Mizusaki et al.

(10) Patent No.: US 12,648,347 B2
(45) Date of Patent: Jun. 2, 2026

(54) LIGHT EMITTING ELEMENT AND DISPLAY DEVICE

(71) Applicant: SHARP KABUSHIKI KAISHA, Sakai City (JP)

(72) Inventors: Masanobu Mizusaki, Sakai City (JP); Masakazu Shibasaki, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 931 days.

(21) Appl. No.: 17/911,954

(22) PCT Filed: Mar. 26, 2020

(86) PCT No.: PCT/JP2020/013727

§ 371 (c)(1),
(2) Date: Sep. 15, 2022

(87) PCT Pub. No.: WO2021/192158

PCT Pub. Date: Sep. 30, 2021

(65) Prior Publication Data

US 2023/0134846 A1 May 4, 2023

(51) Int. Cl.

| | |
|---|---|
| ***H01L 51/54*** | (2006.01) |
| ***H10K 50/15*** | (2023.01) |
| ***H10K 85/30*** | (2023.01) |
| ***H10K 85/60*** | (2023.01) |
| *H10K 50/16* | (2023.01) |
| *H10K 50/165* | (2023.01) |
| *H10K 50/18* | (2023.01) |
| *H10K 101/30* | (2023.01) |
| *H10K 102/00* | (2023.01) |

(52) U.S. Cl.

CPC ........... *H10K 85/30* (2023.02); *H10K 50/156* (2023.02); *H10K 85/654* (2023.02); *H10K 85/6572* (2023.02); *H10K 50/165* (2023.02); *H10K 50/166* (2023.02); *H10K 50/18* (2023.02); *H10K 2101/30* (2023.02); *H10K 2102/302* (2023.02)

(58) Field of Classification Search

None

See application file for complete search history.

(56) References Cited

U.S. PATENT DOCUMENTS

| | | | | |
|---|---|---|---|---|
| 2006/0251921 | A1 | 11/2006 | Forrest et al. | |
| 2006/0279204 | A1 | 12/2006 | Forrest et al. | |
| 2009/0033211 | A1 | 2/2009 | Tanabe et al. | |
| 2009/0146554 | A1* | 6/2009 | Lee .................... | H10K 85/6572 313/504 |
| 2010/0084647 | A1* | 4/2010 | Kondakova ........ | H10K 85/6572 257/E51.026 |
| 2013/0153881 | A1 | 6/2013 | Tokoo et al. | |
| 2016/0118613 | A1 | 4/2016 | Nam | |
| 2019/0280056 | A1 | 9/2019 | Yasukawa | |

FOREIGN PATENT DOCUMENTS

| | | | |
|---|---|---|---|
| JP | 2007266160 | A | 10/2007 |
| JP | 2010027761 | A | 2/2010 |
| JP | 2013048265 | A | 3/2013 |
| JP | 2018206981 | A | 12/2018 |
| JP | 2019160417 | A | 9/2019 |
| KR | 20160054820 | A | 5/2016 |
| WO | 2012039213 | A1 | 3/2012 |

* cited by examiner

*Primary Examiner* — Andrew K Bohaty
(74) *Attorney, Agent, or Firm* — ScienBiziP, P.C.

(57) ABSTRACT

A light-emitting element is provided with an interlayer organic layer having electron transport properties. At a HOMO level, an energy level difference between a first hole transport layer and the second hole transport layer is from 0.0 eV to 0.20 eV, and at a LUMO level, an energy level difference between a first electron transport layer and a second electron transport layer, and an energy level difference between the first electron transport layer and the blue light-emitting layer are each from 0.0 eV to 0.20 eV. Alternatively, the light-emitting element is provided with the interlayer organic layer between the electron transport layer and the cathode electrode, the electron transport layer is formed from a lithium quinolate complex and an organic compound having electron transport properties, and the interlayer organic layer is formed from an organic compound including an amino group or a hydroxyl group.

3 Claims, 4 Drawing Sheets

LIGHT EMITTING ELEMENT AND DISPLAY DEVICE

TECHNICAL FIELD

The disclosure relates to a light-emitting element and a display device including the light-emitting element.

BACKGROUND ART

PTL 1 discloses a method for achieving high efficiency light emission of a light-emitting layer and suppression of degradation of the light-emitting layer by inserting an inter-layer film between each organic layer in an organic light-emitting device provided with a plurality of organic layers between electrodes.

CITATION LIST

Patent Literature

PTL 1: WO 2012/039213 A1

SUMMARY

Technical Problem

Even in the light-emitting device (light-emitting element) disclosed in PTL 1, a shortening of the lifetime of the light-emitting device (light-emitting element) occurs due to an accumulation in each organic layer of carriers injected from each electrode into each organic layer between the electrodes, or in other words, due to a bias of the carrier balance in the light-emitting layer.

In order to solve the problem described above, a light-emitting element according to the disclosure is provided with an anode electrode and a cathode electrode, and further includes, between the anode electrode and the cathode electrode in order from the anode electrode side, a first hole transport layer, a second hole transport layer, a light-emitting layer, a first electron transport layer, and a second electron transport layer, wherein at a HOMO level, an energy level difference between the second hole transport layer and the light-emitting layer of the second hole transport layer side is from 0.0 eV to 0.15 eV, at a LUMO level, an energy level difference between the first electron transport layer and the light-emitting layer of the first electron transport layer side is from 0.0 eV to 0.15 eV, and the second electron transport layer is a mixed layer including an organic material having electron transport properties and an electron-accepting material, and containing the electron-accepting material at an amount greater than 50 mass %.

ADVANTAGEOUS EFFECTS OF DISCLOSURE

According to the configuration described above, carrier balance in the light-emitting layer of the light-emitting element is improved, and degradation of the organic layer in association with bias of the carrier in the light-emitting layer is suppressed. Therefore, a light-emitting element with a longer lifetime and a display device provided with the light-emitting element can be provided.

DESCRIPTION OF EMBODIMENTS

First Embodiment

Figure 1:
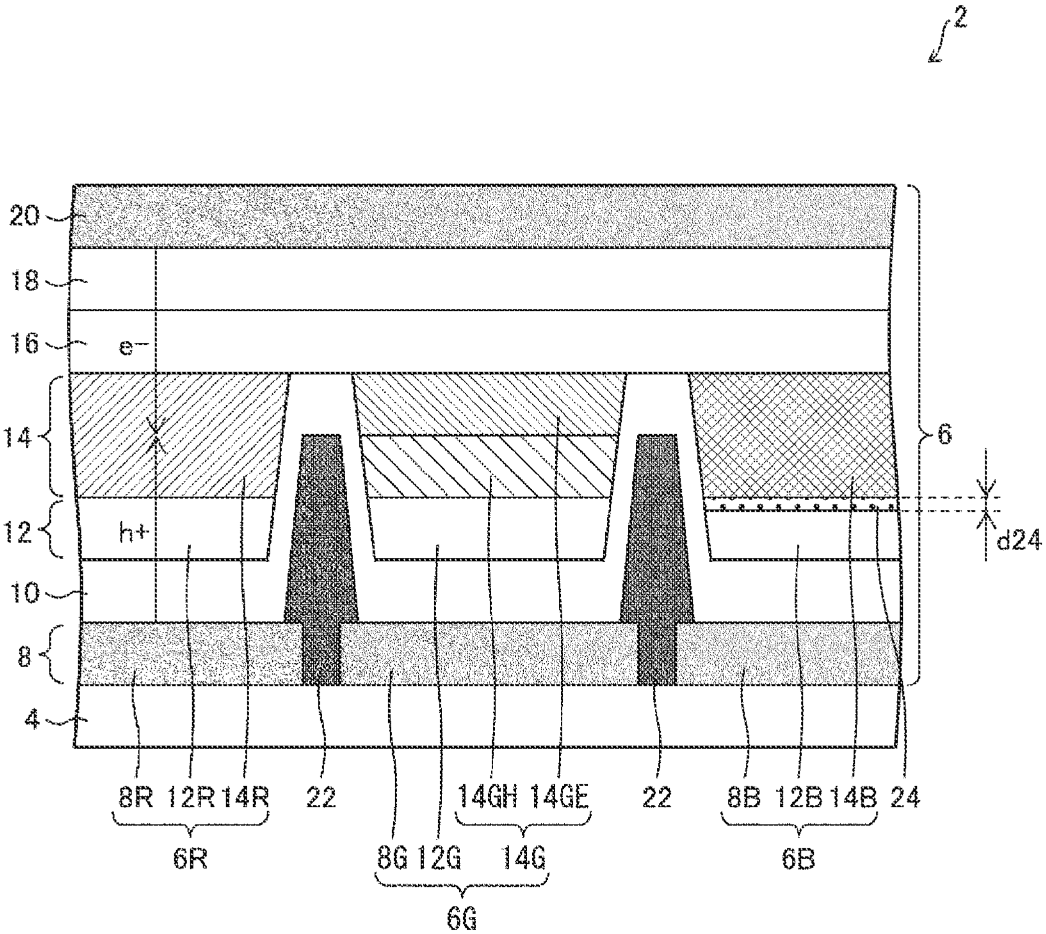
FIG. 1 is a schematic cross-sectional view of a display device according to a first embodiment of the disclosure.
Figure 2:
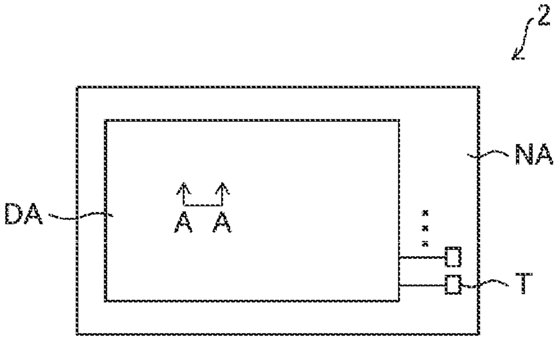
FIG. 2 is a schematic top view of the display device according to the first embodiment of the disclosure.

FIG. 2 is a schematic top view of a display device 2 according to the present embodiment. FIG. 1 is a cross-sectional view taken along a line A-A in FIG. 2.

As illustrated in FIG. 2, the display device 2 according to the present embodiment includes a light-emitting region DA from which light emission is extracted and a frame region NA surrounding a periphery of the light-emitting region DA. A terminal T into which is input a signal for driving each light-emitting element of the display device 2 described in detail below is formed in the frame region NA.

At a position overlapping with the light-emitting region DA in a plan view, as illustrated in FIG. 1, the display device 2 according to the present embodiment includes an array substrate 4 and a light-emitting element layer 6 on the array substrate 4. In particular, the display device 2 has a structure in which respective layers of the light-emitting element layer 6 are laminated on the array substrate 4, in which a Thin Film Transistor (TFT; not illustrated) is formed. Note that, in the present specification, a direction from the light-emitting element layer 6 to the array substrate 4 of the display device 2 is referred to as a "downward direction", and a direction from the light-emitting element layer 6 of the display device 2 to the display surface of the display device 2 is referred to as an "upward direction".

The light-emitting element layer 6 includes, on an anode electrode 8, a first hole transport layer 10, a second hole transport layer 12, a light-emitting layer 14, a first electron transport layer 16, a second electron transport layer 18, and a cathode electrode 20, sequentially laminated from the lower layer. The anode electrode 8 of the light-emitting element layer 6 formed in an upper layer on the array substrate 4 is electrically connected with TFTs of the array substrate 4. Note that, in the display device 2, a sealing layer (not illustrated) is provided to seal the light-emitting element layer 6.

In the present embodiment, the light-emitting element layer 6 includes a light-emitting element 6R, a light-emitting element 6G, and a light-emitting element 6B. The light-emitting element 6R, the light-emitting element 6G, and the light-emitting element 6B may be organic EL elements, that is, OLED elements, in which the light-emitting layer 14 includes an organic fluorescent material or an organic phosphorescent material. In addition to this, the light-emitting element 6R, the light-emitting element 6G, and the light-emitting element 6B may be QLED elements in which the light-emitting layer 14 includes a semiconductor nanoparticle material, that is, a quantum dot material. However, in the present embodiment, various light-emitting elements, without being limited to the OLED elements or the QLED elements, can be used for the light-emitting element 6R, the light-emitting element 6G, and the light-emitting element 6B. The display device 2 has, for example, a plurality of sub-pixels, and each sub-pixel is provided with one light-emitting element 6R, one light-emitting element 6G, and one light-emitting element 6B described above.

Here, each of the anode electrode 8, the second hole transport layer 12, and light-emitting layer 14 is separated by edge covers 22. In particular, in the present embodiment, the anode electrode 8 is separated into an anode electrode 8R for the light-emitting element 6R, an anode electrode 8G for the light-emitting element 6G, and an anode electrode 8B for the light-emitting element 6B by the edge covers 22. The second hole transport layer 12 is separated into a second hole transport layer 12R for the light-emitting element 6R, a second hole transport layer 12G for the light-emitting element 6G, and a second hole transport layer 12B for the light-emitting element 6B by the edge covers 22. Furthermore, the light-emitting layer 14 is separated into a light-emitting layer 14R, a light-emitting layer 14G, and a light-emitting layer 14B by the edge covers 22.

Furthermore, the light-emitting layer 14G includes a first light-emitting layer 14GH and a second light-emitting layer 14GE laminated from the anode electrode 8 side. The first light-emitting layer 14GH is a hole transport type light-emitting layer, and the second light-emitting layer 14GE is an electron transport type light-emitting layer. In other words, the first light-emitting layer 14GH includes a host material having hole transport properties, and the second light-emitting layer 14GE includes a host material having electron transport properties.

Thus, in the present embodiment, the light-emitting layer 14G includes at least two or more types of host materials. In particular, in the present embodiment, the light-emitting layer 14G is provided with only one type of host material in the first light-emitting layer 14GH and only one type of host material in the second light-emitting layer 14GE, the host materials thereof being mutually different, and therefore the light-emitting layer 14G includes only two types of host materials.

Note that the first hole transport layer 10, the first electron transport layer 16, the second electron transport layer 18, and the cathode electrode 20 are not separated by the edge covers 22, and are formed in common.

As illustrated in FIG. 1, the edge covers 22 may be formed at positions covering the side surfaces and a vicinity of peripheral end portions of the upper faces of the anode electrode 8.

In the present embodiment, the light-emitting element 6B is further provided with a first interlayer organic layer 24 as the interlayer organic layer between the second hole transport layer 12B and the light-emitting layer 14B. The first interlayer organic layer 24 is an organic layer having electron transport properties similar to the first electron transport layer 16 and the second electron transport layer 18. In other words, the first interlayer organic layer 24 is configured from an organic material having electron transport properties, and the electron mobility in the first interlayer organic layer 24 is greater than the hole mobility in the first interlayer organic layer 24.

In particular, the electron mobility of the organic material constituting the first interlayer organic layer 24 is 100 times or more greater than the hole mobility of the organic material thereof.

Specifically, the organic material constituting the first interlayer organic layer 24 is a pyrimidine derivative (B3PymPm) represented by the following formula.

[Chem. 1]

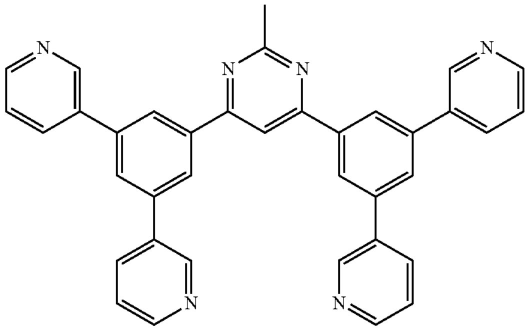

In addition, the organic material constituting the first interlayer organic layer 24 may be a silole derivative (PyPySPyPy) or a bipyrimidine oxadiazole derivative, which are each represented by the following formulas.

[Chem. 2]

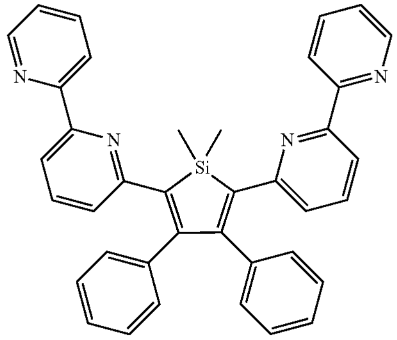

[Chem. 3]

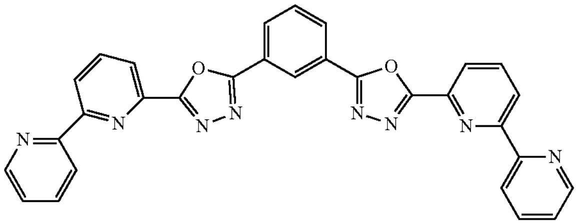

In the present embodiment, the first interlayer organic layer 24 has a layer thickness d24. In the present embodiment, the layer thickness d24 is, for example, from 0.1 nm to 2.0 nm, and for a reason described below, the layer thickness d24 is preferably from 0.3 nm to 1.5 nm.

Here, in the present specification, the layer thickness of a certain layer may be an average value of the layer thickness of the layer, or may be an average value of the layer thickness of the layer at a position at which the layer is formed substantially horizontal to the array substrate 4.

In the present embodiment, the light-emitting element 6R includes the anode electrode 8R, the first hole transport layer 10, the second hole transport layer 12R, the light-emitting layer 14R, the first electron transport layer 16, the second electron transport layer 18, and the cathode electrode 20.

The light-emitting element 6G includes the anode electrode 8G, the first hole transport layer 10, the second hole transport layer 12G, the light-emitting layer 14G, the first electron transport layer 16, the second electron transport layer 18, and the cathode electrode 20. Furthermore, the light-emitting element 6B includes the anode electrode 8B, the first hole transport layer 10, the second hole transport layer 12B, the first interlayer organic layer 24, the light-emitting layer 14B, the first electron transport layer 16, the second electron transport layer 18, and the cathode electrode 20.

In the present embodiment, the light-emitting layer 14R is a red light-emitting layer that emits red light, the light-emitting layer 14G is a green light-emitting layer that emits green light, and the light-emitting layer 14B is a blue light-emitting layer that emits blue light. In other words, the light-emitting element 6R is a red light-emitting element that emits red light, the light-emitting element 6G is a green light-emitting element that emits green light, and the light-emitting element 6B is a blue light-emitting element that emits blue light.

Here, the blue light refers to, for example, light having a light emission central wavelength in a wavelength band of equal to or greater than 400 nm and equal to or less than 500 nm. The green light refers to, for example, light having a light emission central wavelength in a wavelength band of greater than 500 nm and equal to or less than 600 nm. The red light refers to, for example, light having a light emission central wavelength in a wavelength band of greater than 600 nm and equal to or less than 780 nm.

In the present embodiment, the light-emitting layer 14B is in contact with the first interlayer organic layer 24 at the anode electrode 8 side, and is in contact with the first electron transport layer 16 at the cathode electrode 20 side. In other words, the light-emitting layer 14R and the light-emitting layer 14B, which are single layers, are in contact with both the first interlayer organic layer 24 and the first electron transport layer 16.

The light-emitting layer 14R is in contact with the second hole transport layer 12 at the anode electrode 8 side, and is in contact with the first electron transport layer 16 at the cathode electrode 20 side. In other words, the light-emitting layer 14R, which is a single layer, is in contact with both the second hole transport layer 12 and the first electron transport layer 16.

On the other hand, the first light-emitting layer 14GH is in contact with the second hole transport layer 12 on the anode electrode 8 side, and is in contact with the second light-emitting layer 14GE on the cathode electrode 20 side. The second light-emitting layer 14GE is in contact with the first light-emitting layer 14GH on the anode electrode 8 side and is in contact with the first electron transport layer 16 on the cathode electrode 20 side.

The anode electrode 8 and the cathode electrode 20 include conductive materials and are electrically connected to the first hole transport layer 10 and the second electron transport layer 18, respectively. Of the anode electrode 8 and the cathode electrode 20, the electrode closer to the display surface of the display device 2 is a semitransparent electrode.

The anode electrode 8 has a configuration in which ITO (Indium Tin Oxide) is laminated on, for example, an Ag—Pd—Cu alloy. The anode electrode 8 having the above configuration is a reflective electrode that reflects light emitted from the light-emitting layer 14. Thus, among the light emitted from the light-emitting layer 14, light directed in the downward direction can be reflected by the anode electrode 8.

On the other hand, the cathode electrode 20 is configured by, for example, a semitransparent Mg—Ag alloy. In other words, the cathode electrode 20 is a transmissive electrode that transmits light emitted from the light-emitting layer 14. Thus, among the light emitted from the light-emitting layer 14, light directed in the upward direction passes through the cathode electrode 20. In this manner, the display device 2 can emit the light emitted from the light-emitting layer 14 in the upward direction.

As described above, in the display device 2, both the light emitted in the upward direction and the light emitted in the downward direction from the light-emitting layer 14 can be directed toward the cathode electrode 20 (upward direction). That is, the display device 2 is configured as a top-emitting type display device.

In the present embodiment, the cathode electrode 20, which is a semitransparent electrode, may partially reflect the light emitted from the light-emitting layer 14. In addition, a cavity of the light emitted from the light-emitting layer 14 is formed between the anode electrode 8, which is a reflective electrode, and the cathode electrode 20, which is a semitransparent electrode. By forming the cavity between the anode electrode 8 and the cathode electrode 20, the chromaticity of the light emitted from the light-emitting layer 14 can be improved.

Note that the configuration of the anode electrode 8 and the cathode electrode 20 described above is an example, and may be another configuration.

The light-emitting layer 14 is a layer that emits light as a result of an occurrence of recombination between the positive holes transported from the anode electrode 8 and the electrons transported from the cathode electrode 20. Note that in the light-emitting element 6G, the positive holes transported to the first light-emitting layer 14GH and the electrons transported to the second light-emitting layer 14GE are transported to the interface between the first light-emitting layer 14GH and the second light-emitting layer 14GE, and recombine in the vicinity of the interface.

The first hole transport layer 10 and the second hole transport layer 12 are layers that transport positive holes from the anode electrode 8 to the light-emitting layer 14. The second hole transport layer 12 has a function of inhibiting the transport of electrons from the cathode electrode 20. The first electron transport layer 16 and the second electron transport layer 18 are layers that transport electrons from the cathode electrode 20 to the light-emitting layer 14. The first electron transport layer 16 has a function of inhibiting the transport of positive holes from the anode electrode 8.

In the present embodiment, the second electron transport layer 18 is a mixed layer including an organic material having electron transport properties and an electron-accepting material. The electron-accepting material included in the second electron transport layer 18 has a function of temporarily capturing the electrons transported by the electron-transporting organic material of the second electron transport layer 18 while the electrons are transported to the first electron transport layer 16. Thus, the electron-accepting material included in the second electron transport layer 18 causes the transport of electrons to the first electron transport layer 16, and by extension the transport of electrons to the light-emitting layer 14, to be more stably implemented. Accordingly, an injection of excess electrons in the light-emitting layer 14 is prevented, and electron excess in the light-emitting layer 14 can be prevented.

In the present embodiment, for example, the electron-transporting organic material included in the second electron transport layer 18 is an oxadiazole derivative (OXD-7) represented by the following formula.

[Chem. 4]

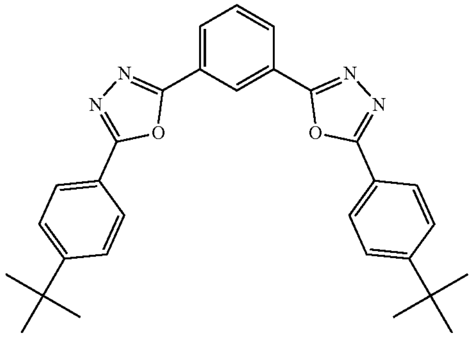

In addition, the electron-transporting organic material included in the second electron transport layer 18 may be a starburst OXD, an oxadiazole derivative (Bu-PBD), a triazole derivative, or bathocuproine, which are represented by the following formulas, respectively.

[Chem. 5]

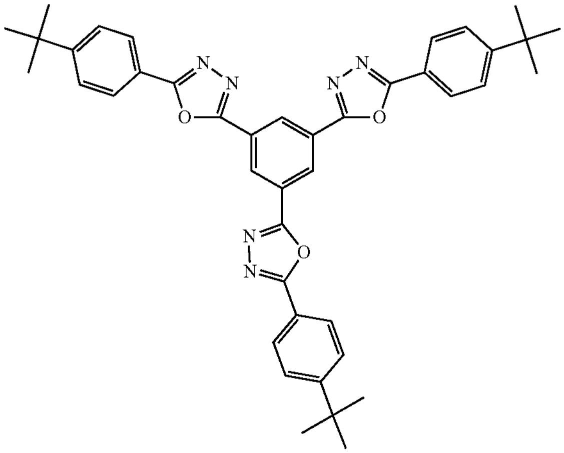

[Chem. 6]

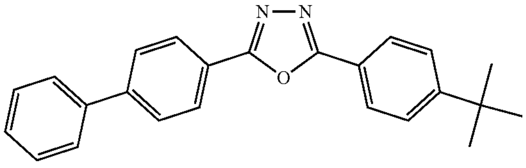

[Chem. 7]

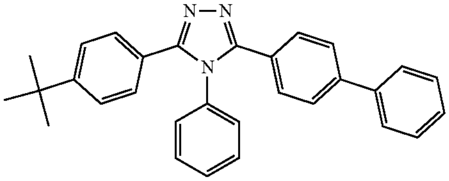

In the present embodiment, the electron-accepting material included in the second electron transport layer 18 is, for example, a lithium complex or a lithium compound. Specifically, for example, the electron-accepting material included in the second electron transport layer 18 is a lithium quinolate complex (Liq) represented by the following formula.

[Chem. 9]

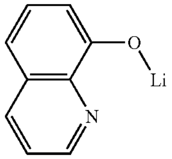

The second electron transport layer 18 includes the lithium quinolate complex as an electron-accepting material, and thereby electrons of the second electron transport layer 18 are more stably transported to the first electron transport layer 16.

In addition, the electron-accepting material included in the second electron transport layer 18 may be lithium trifluoromethanesulfonyl (Li-TFSI), lithium acetoacetate, lithium bis (trimethylsilyl) amide, lithium butoxide, or, alternatively, lithium 1,1,2,2,3,3-hexafluoropropane-1,3-disulfonimide, represented by the following formulas, respectively.

[Chem. 10]

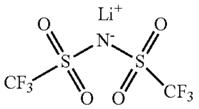

[Chem. 11]

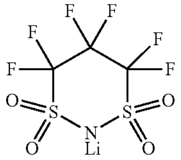

[Chem. 12]

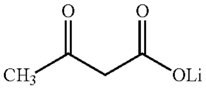

[Chem. 13]

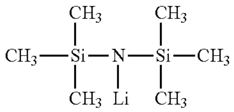

[Chem. 14]

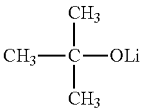

The first hole transport layer 10, the second hole transport layer 12, the light-emitting layer 14, the first electron transport layer 16, and the second electron transport layer 18 may be formed by a known technique, and may be formed by, for example, vapor deposition using a vapor deposition mask. In particular, the second electron transport layer 18 may be formed by co-evaporation of an organic material having electron transport properties and an electron-accepting material.

Note that the display device 2 according to the present embodiment may include, between the anode electrode 8 and the first hole transport layer 10, a hole injection layer (not illustrated) containing a hole injection material. Similarly, the display device 2 according to the present embodiment may include, between the cathode electrode 20 and the second electron transport layer 18, an electron injection layer (not illustrated) containing an electron injection material.

Figure 3:
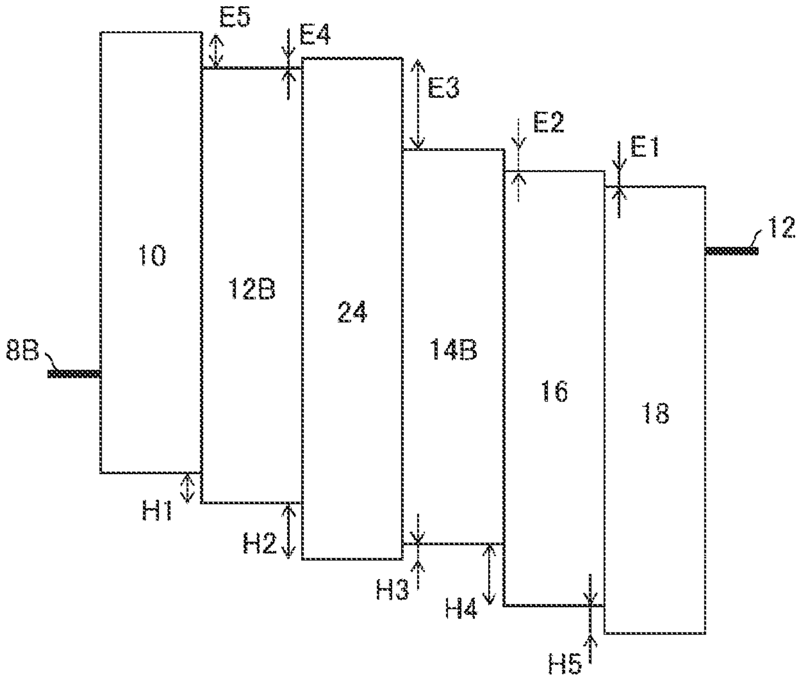
FIG. 3 is an energy diagram illustrating an example of the Fermi level, or the LUMO level and the HOMO level, of each layer in the light-emitting element of the display device according to the first embodiment of the disclosure.

Next, an energy band of each layer of the light-emitting element 6B of the display device 2 according to the present embodiment will be described with reference to FIG. 3. FIG. 3 is an energy band diagram illustrating an example of the Fermi level or the band gap of each layer of the light-emitting element 6B of the display device 2 according to the present embodiment.

Note that the energy band diagram of the present specification illustrates the energy level of each layer on the basis of a vacuum level. Further, the energy band diagram of the present specification illustrates a Fermi level or a band gap of a member corresponding to a provided member number. The Fermi levels are indicated for the anode electrode 8 and the cathode electrode 20, and the band gaps from the LUMO level to the HOMO level are indicated for the first hole transport layer 10, the second hole transport layer 12, the first interlayer organic layer 24, the light-emitting layer 14, the first electron transport layer 16, and the second electron transport layer 18.

Here, the difference between the HOMO level and the LUMO level between each layer in the light-emitting element layer 6 according to the present embodiment will be described with reference to FIG. 3. In the present specification, a value obtained by subtracting the value of the HOMO level of the second layer from the value of the HOMO level of the first layer is referred to as an energy level difference between the HOMO level of the first layer and the HOMO level of the second layer. On the other hand, in the present specification, a value obtained by subtracting the value of the LUMO level of the first layer from the value of the LUMO level of the second layer is referred to as an energy level difference between the LUMO level of the first layer and the LUMO level of the second layer.

In FIG. 3, H1 indicates the energy level difference between the HOMO level of the first hole transport layer 10 and the HOMO level of the second hole transport layer 12B, of the light-emitting element 6B. H2 indicates the energy level difference between the HOMO level of the second hole transport layer 12B and the HOMO level of the first interlayer organic layer 24, of the light-emitting element 6B. H3 indicates the energy level difference between the HOMO level of the first interlayer organic layer 24 and the HOMO level of the light-emitting layer 14B, of the light-emitting element 6B. H4 indicates the energy level difference between the HOMO level of the light-emitting layer 14B and the HOMO level of the first electron transport layer 16, of the light-emitting element 6B. H5 indicates the energy level difference between the HOMO level of the first electron transport layer 16 and the HOMO level of the second electron transport layer 18, of the light-emitting element 6B.

In FIG. 3, E1 indicates the energy level difference between the LUMO level of the second electron transport layer 18 and the LUMO level of the first electron transport layer 16, of the light-emitting element 6B. E2 indicates the energy level difference between the LUMO level of the first electron transport layer 16 and the LUMO level of the light-emitting layer 14B, of the light-emitting element 6B. E3 indicates the energy level difference between the LUMO level of the light-emitting layer 14 and the LUMO level of the first interlayer organic layer 24, of the light-emitting element 6B. E4 indicates the energy level difference between the LUMO level of the first interlayer organic layer 24 and the LUMO level of the second hole transport layer 12B, of the light-emitting element 6B. E5 indicates the energy level difference between the LUMO level of the second hole transport layer 12B and the LUMO level of the first hole transport layer 10, of the light-emitting element 6B.

In the light-emitting element 6B according to the present embodiment, the energy level difference H1, the energy level difference E1, and the energy level difference E2 are all from 0.0 eV to 0.20 eV. In other words, in the light-emitting element 6B, the energy level difference in terms of the HOMO level between the first hole transport layer 10 and second hole transport layer 12B is from 0.0 eV to 0.20 eV. In addition, the energy level difference in terms of the LUMO level between the first electron transport layer 16 and the second electron transport layer 18, and the energy level difference in terms of the LUMO level between the first electron transport layer 16 and the light-emitting layer 14B are both from 0.0 eV to 0.20 eV.

According to the configuration described above, in the light-emitting element 6B, barriers of injection of positive holes from the first hole transport layer 10 to the second hole transport layer 12B, barriers of injection of electrons from the second electron transport layer 18 to the first electron transport layer 16, and barriers of injection of electrons from the first electron transport layer 16 to the light-emitting layer 14B are reduced. Thus, the injection efficiency of each carrier into the light-emitting layer 14B is improved in the light-emitting element 6B.

Moreover, in the light-emitting element 6B according to the present embodiment, the energy level difference H2 is from 0.0 eV to 0.20 eV. In other words, in the light-emitting element 6B, the energy level difference in terms of the HOMO level between the second hole transport layer 12B and the first interlayer organic layer 24 is from 0.0 eV to 0.20 eV.

Similarly, in the light-emitting element 6B according to the present embodiment, the energy level difference H3 is from 0.0 eV to 0.05 eV. In other words, in the light-emitting element 6B, the energy level difference in terms of the HOMO level between the first interlayer organic layer 24 and the light-emitting layer 14B is from 0.0 eV to 0.05 eV.

According to the configuration described above, in the light-emitting element 6B, barriers of injection of positive holes from the second hole transport layer 12B into the first interlayer organic layer 24, and barriers of injection of positive holes from the first interlayer organic layer 24 into the light-emitting layer 14B are reduced. Thus, the injection efficiency of the positive holes into the light-emitting layer 14B is improved in the light-emitting element 6B, and electron-excess is more efficiently prevented.

The value of the HOMO level of the light-emitting layer 14B is greater than the value of the HOMO level of the first electron transport layer 16 by 0.25 eV or more, and more preferably by 0.45 eV or more. Furthermore, the value of the LUMO level of the first interlayer organic layer 24 is greater than the value of the LUMO level of the light-emitting layer 14B by 0.25 eV or more, and more preferably by 0.45 eV or more.

According to these configurations, in the light-emitting element 6B, the outward flow of positive holes injected into the light-emitting layer 14B towards the first electron transport layer 16 side, and the outward flow of electrons injected into the light-emitting layer 14B towards the first interlayer organic layer 24 side are more effectively reduced. Through this, the electron concentration and the positive hole concentration in the light-emitting layer 14B of the light-emitting element 6B are improved, and the efficiency of recombination of the carriers is enhanced. Furthermore, in the light-emitting element 6B, damage to each organic layer in association with the outward flow of carriers injected into the light-emitting layer 14B is reduced, and thus the lifetime of the light-emitting element 6B is improved.

In the light-emitting element 6B according to the present embodiment, the energy level difference E4 is from 0.0 eV to 0.05 eV. In other words, in the light-emitting element 6B, the energy level difference in terms of the LUMO level between the second hole transport layer 12B and the first interlayer organic layer 24 is from 0.0 eV to 0.05 eV.

When the value of the LUMO level of the first interlayer organic layer 24 is small compared to the value of the LUMO level of the second hole transport layer 12B, an outward flow of electrons from the light-emitting layer 14B to the first interlayer organic layer 24 easily occurs. In association therewith, an outward flow of electrons from the light-emitting layer 14B to the second hole transport layer 12B easily occurs via the first interlayer organic layer 24.

According to the configuration described above, the difference between the LUMO levels of the second hole transport layer 12B and the first interlayer organic layer 24 is sufficiently close. As a result, the value of the LUMO level of the first interlayer organic layer 24 increases compared to the value of the LUMO level of the light-emitting layer 14B, and the outward flow of electrons from the light-emitting layer 14B to the second hole transport layer 12B via the first interlayer organic layer 24 is less likely to occur. Therefore, through the configuration described above, degradation of the second hole transport layer 12B in association with the outward flow of electrons from the light-emitting layer 14B to the second hole transport layer 12B is reduced, and the lifetime of the light-emitting element 6B is improved.

As described above, in the light-emitting element 6B according to the present embodiment, the energy level difference H1, the energy level difference E1, and the energy level difference E2 are all from 0.0 eV to 0.20 eV. According to the configuration described above, the injection efficiency of each carrier into the light-emitting layer 14 is improved in each of the light-emitting element 6B, the light-emitting element 6G, and the light-emitting element 6R.

In addition, the light-emitting element 6B according to the present embodiment is provided with, between the second hole transport layer 12B and the light-emitting layer 14B, a first interlayer organic layer 24 having electron transport properties. Thus, according to the configuration described above, in the light-emitting element 6B, the first interlayer organic layer 24 can reduce the outward flow of electrons from the light-emitting layer 14B to the second hole transport layer 12B. In particular, when the electron mobility of the organic material constituting the first interlayer organic layer 24 is greater than the hole mobility of the organic material thereof by 100-times or more, the outward flow of electrons described above can be more efficiently reduced.

By preventing the outward flow of electrons from the light-emitting layer 14 to each layer of the second hole transport layer 12 side, recombination of charges that do not contribute to light emission is less likely to occur even in each layer further to the second hole transport layer 12 side than the light-emitting layer 14. Through this, damage to the light-emitting layer 14 and to each layer further to the second hole transport layer 12 side than the light-emitting layer 14 is prevented, and the lifetime of the light-emitting element 6B is improved.

Accordingly, the light-emitting element 6B according to the present embodiment can eliminate electron excess in the light-emitting layer 14 while maintaining the transport efficiency of each carrier to the light-emitting layer 14. Therefore, the light-emitting element 6B according to the present embodiment more efficiently improves the lifetime.

Ordinarily, in a light-emitting element having an organic layer, like the light-emitting elements included in the display device 2 according to the present embodiment, the lifetime of the blue light-emitting element tends to be shorter than that of the green light-emitting element and the red light-emitting element. As described above, the display device 2 according to the present embodiment is provided with a light-emitting element 6B, which is a blue light-emitting element having an improved lifetime, and thus the lifetime of the light-emitting element 6B is lengthened in relation to the lifetime of the light-emitting element 6G and the light-emitting element 6R. Therefore, the overall lifetime of the display device 2 according to the present embodiment can be further improved.

Light-emitting elements according to each of Examples 1 and 2 below were prepared with each light-emitting element having the same configuration as each light-emitting element of the display device 2 according to the present embodiment, and the physical properties were measured.

Example 1

A light-emitting element according to Example 1 was prepared with the same structure as the light-emitting element 6B of the display device 2 according to the present embodiment.

In the manufacturing of the light-emitting element according to the present example, ITO was first formed as an anode electrode 8.

Next, a film of a first hole transport layer 10 (HOMO: −5.50 eV, LUMO: −2.42 eV) containing an aromatic amine-based compound was formed as a hole transport material on the anode electrode 8 through low-temperature chemical vapor deposition (CVD) of the hole transport material.

Next, a film of a second hole transport layer 12B (HOMO: −5.60 eV, LUMO: −2.52 eV) containing a carbazole-based compound was formed as an electron blocking material on an upper layer of the first hole transport layer 10 through low-temperature CVD of the electron blocking material.

Next, a first interlayer organic layer 24 was formed through vapor deposition of the pyrimidine derivative (B3PymPm) (HOMO: −5.77 eV, LUMO: −2.52 eV) described above onto the upper layer of the second hole transport layer 12B. In the present example, the layer thickness d24 of the first interlayer organic layer 24 was set to 1.0 nm.

Next, a light-emitting layer 14B was formed on the upper layer of the first interlayer organic layer 24. The light-emitting layer 14B was formed by co-evaporation of an anthracene-adamantane based compound (HOMO: −5.74 eV, LUMO: −2.88 eV) serving as a host material and an anthracene-naphthalene based compound (HOMO: −5.85 eV, LUMO: −2.90 eV) serving as a fluorescence emission dopant.

Next, a first electron transport layer 16 (HOMO: −6.00 eV, LUMO: −2.95 eV) containing a triazole-based compound was formed as a hole blocking material on the upper layer of the light-emitting layer 14B by vapor deposition of the hole blocking material.

Next, a second electron transport layer 18 was formed on the upper layer of the first electron transport layer 16. The second electron transport layer 18 was formed by co-evaporation of an electron-transporting organic material and a lithium quinolate complex (HOMO: −5.78 eV, LUMO: −3.46 eV) at a mass ratio of 1:1. An oxadiazole derivative (OXD-7) (HOMO: −6.34 eV, LUMO: −2.92 eV) was used as the organic material having electron transport properties, of the second electron transport layer 18.

In the present example, lithium fluoride was further deposited on the upper layer of the second electron transport layer 18 to form an electron injection layer.

An alloy of Mg—Ag was then vapor deposited on the upper layer of the electron injection layer to form a cathode electrode 20.

In the present example, a capping layer made from a compound containing an aromatic amine group was further formed by vapor deposition on the upper layer of the cathode electrode 20, and the light-emitting element was then sealed using a sealing material containing an inorganic-organic composite material.

In the present example, a light-emitting element that emits light of (x, y)=(0.140, 0.050) in CIE chromaticity coordinates was obtained. Note that in the present example, the difference between the value of the LUMO level of the light-emitting layer 14B and the value of the HOMO level of the light-emitting layer 14B was 2.95 eV.

Example 2

A light-emitting element according to Example 2 was prepared with the same structure as the light-emitting element 6B of the display device 2 according to the present embodiment.

In the manufacturing of the light-emitting element according to the present example, ITO was first formed as an anode electrode 8.

Next, a film of a first hole transport layer 10 (HOMO: −5.49 eV, LUMO: −2.41 eV) containing an aromatic amine-based compound was formed as a hole transport material on the anode electrode 8 through low-temperature CVD of the hole transport material.

Next, a film of a second hole transport layer 12B (HOMO: −5.62 eV, LUMO: −2.53 eV) containing a carbazole-based compound was formed as an electron blocking material on the upper layer of the first hole transport layer 10 through low-temperature CVD of the electron blocking material.

Next, a first interlayer organic layer 24 was formed through vapor deposition of the above-described pyrimidine derivative (B3PymPm) (HOMO: −5.78 eV, LUMO: −2.49 eV) onto the upper layer of the second hole transport layer 12B. In the present example, the layer thickness d24 of the first interlayer organic layer 24 was set to 1.0 nm.

Next, a light-emitting layer 14B was formed on the upper layer of the first interlayer organic layer 24. The light-emitting layer 14B was formed by co-evaporation of an anthracene-phenyl based compound (HOMO: −5.74 eV, LUMO: −2.82 eV) serving as a host material and a rubrene-based compound (HOMO: −5.80 eV, LUMO: −2.86 eV) serving as a fluorescence emission dopant.

Next, a first electron transport layer 16 (HOMO: −6.07 eV, LUMO: −2.87 eV) containing a triazole based compound was formed as a hole blocking material on the upper layer of the light-emitting layer 14B by vapor deposition of the hole blocking material.

Next, a second electron transport layer 18 having the same configuration as the second electron transport layer 18 according to Example 1 was formed on the upper layer of the first electron transport layer 16 using the same technique as the technique presented in Example 1.

In the present example, ytterbium (Yb) was further vapor deposited onto the upper layer of the second electron transport layer 18 to form an electron injection layer.

Through the same methods as those in the previous example, the cathode electrode 20 and the capping layer were formed on the upper layer of the electron injection layer, and the light-emitting element was sealed by the sealing material.

In the present example, a light-emitting element that emits light of (x, y)=(0.136, 0.048) in CIE chromaticity coordinates was obtained. Note that in the present example, the difference between the value of the LUMO level of the light-emitting layer 14B and the value of the HOMO level of the light-emitting layer 14B was 2.94 eV.

Note that the electron mobility of the first interlayer organic layer 24 of the light-emitting element according to each of Example 1 and Example 2 was $2\times10^{-2}$ $cm^2$/Vs, and the hole mobility was $7\times10.6$ $cm^2$/Vs. The carrier mobility of the first interlayer organic layer 24 was measured by impedance spectroscopy.

Light-emitting elements according to Comparative Example 1 and Comparative Example 2 were prepared in relation to each of the light-emitting elements of Example 1 and Example 2, and the physical properties were measured.

The light-emitting element according to Comparative Example 1 was prepared with the same configuration as that of the light-emitting element of Example 1 with the exception that the first interlayer organic layer 24 was not formed. The light-emitting element according to Comparative Example 2 was prepared with the same configuration as that of the light-emitting element of Example 2 with the exception that the first interlayer organic layer 24 was not formed.

Next, the physical properties of the light-emitting elements according to the examples and the comparative examples described above were measured, and the physical properties thereof were compared.

First, the values of the HOMO level and the LUMO level of each layer of each light-emitting element were measured, and the HOMO level difference and the LUMO level difference between each layer were measured. Specifically, a Photoemission Yield Spectroscopy (PYS) apparatus (AC-3, available from RIKEN KEIKI Co., Ltd.) was used to determine the value of the HOMO level of each layer of each light-emitting element. Furthermore, the value of the LUMO level was determined by measuring the band gap of each layer of each light-emitting element by the ultraviolet spectrum measurement.

Figure 4:
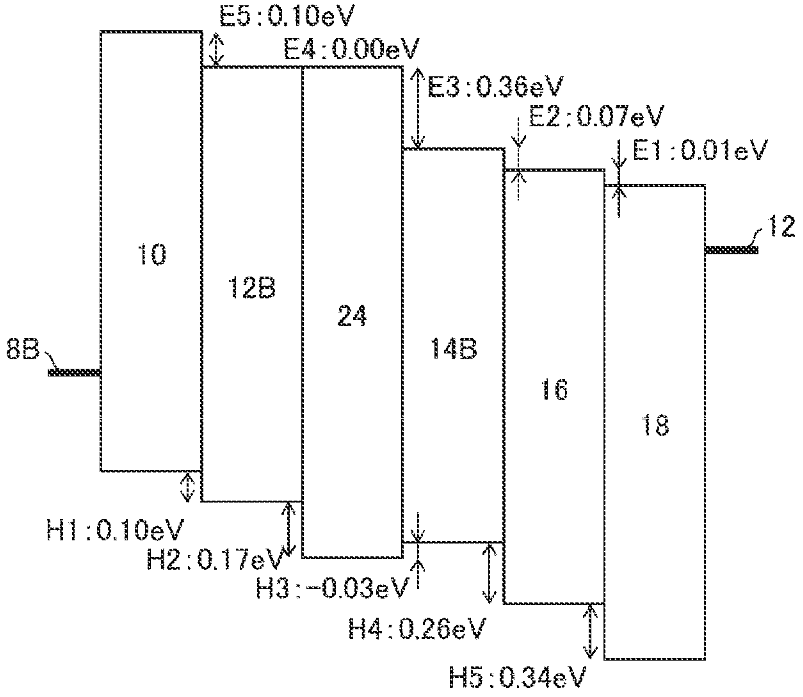
FIG. 4 is an energy diagram illustrating an example of the Fermi level, or the LUMO level and the HOMO level, of each layer in a light-emitting element according to an Example 1 of the disclosure.
Figure 5:
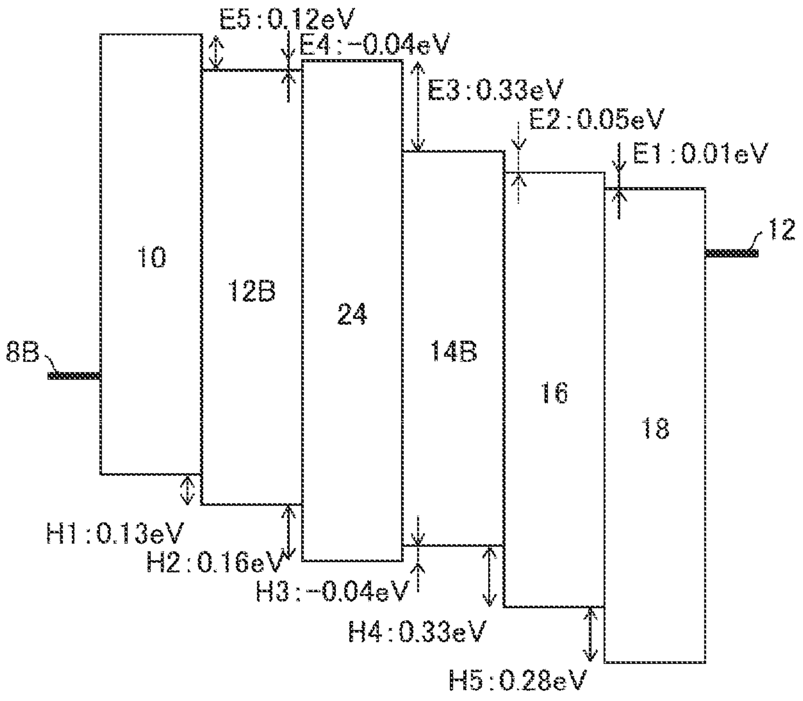
FIG. 5 is an energy diagram illustrating an example of the Fermi level, or the LUMO level and the HOMO level, of each layer in a light-emitting element according to an Example 2 of the disclosure.

The energy diagrams of each layer of the light-emitting elements according to each of the examples and comparative examples are illustrated in FIG. 4 and FIG. 5 based on the results of the measurements. FIG. 4 and FIG. 5 respectively illustrate energy diagrams of each layer of the light-emitting elements according to each of Example 1 and Example 2.

Next, under an environmental temperature of 25 degrees Celsius, a voltage generated by a current having a current density of 10 mA/$cm^2$ was applied between electrodes of each of the light-emitting elements, and the external quantum efficiency and the lifetime were measured.

The measured physical properties of the light-emitting elements according to each of the examples and the comparative examples are listed in Table 1 below.

TABLE 1

| | Example 1 | Example 2 | Comparative Example 1 | Comparative Example 2 |
|---|---|---|---|---|
| H1(eV) | 0.10 | 0.13 | 0.10 | 0.13 |
| H2(eV) | 0.17 | 0.16 | 0.14 | 0.12 |
| H3(eV) | −0.03 | −0.04 | | |
| H4(eV) | 0.26 | 0.33 | 0.26 | 0.33 |
| H5(eV) | 0.34 | 0.28 | 0.34 | 0.28 |
| E1(eV) | 0.01 | 0.01 | 0.01 | 0.01 |
| E2(eV) | 0.07 | 0.05 | 0.07 | 0.05 |
| E3(eV) | 0.36 | 0.33 | 0.36 | 0.29 |
| E4(eV) | 0.00 | −0.04 | | |
| E5(eV) | 0.10 | 0.12 | 0.1 | 0.12 |
| Voltage (V) | 4.3 | 4.4 | 4.2 | 4.0 |
| EQE(%) | 13.0 | 12.6 | 13.3 | 12.9 |
| Lifetime (h) | 5500 | 6600 | 3200 | 3700 |

In Table 1, the columns of "Example 1" and "Example 2" indicate the physical properties of the light-emitting elements according to the respective examples.

In Table 1, the rows of "H1" to "H5" and "E1" to "E5" indicate energy values of the energy level differences H1 to H5 and energy level differences E1 to E5, respectively, in units of eV. Note that in each of the examples, the negative numeric values in the row of "H3" indicate that the value of the HOMO level of the first interlayer organic layer 24 was smaller than the value of the HOMO level of the light-emitting layer 14B. Also, in Example 2, the negative numeric value in the row of "E4" indicates that the value of the LUMO level of the second hole transport layer 12B was smaller than the value of the LUMO level of the first interlayer organic layer 24.

Note that for each of the comparative examples in Table 1, a level difference between the second hole transport layer 12B and the light-emitting layer 14B at the HOMO level is presented in the row "H2". Similarly, for each of the comparative examples in Table 1, a level difference between the second hole transport layer 12B and the light-emitting layer 14B at the LUMO level is presented in the row "E3". In addition, values are not entered for the comparative examples in the "H3" and "E4" rows of Table 1.

In Table 1, the "voltage" row indicates, in units of V, the magnitude of the voltage required to generate a current with a current density of 10 $mA/cm^2$ between the electrodes of each light-emitting element. The "EQE" row indicates the percentage of external quantum efficiency of each light-emitting element under the application of the above voltage. The "lifetime" row indicates, in units of hours (h), the time period until the luminance of each light-emitting element reached 90 percent of the initial luminance at an environmental temperature of 25° C. and under the application of the above voltage.

Next, the physical properties of the light-emitting elements according to each of Example 1 and Example 2 were measured for a case in which the layer thickness d24 of the first interlayer organic layer 24 was changed. For the light-emitting element according to Example 1, the layer thickness d24 was changed from 0.3 nm to 2.0 nm, and for the light-emitting element according to Example 2, the layer thickness d24 was changed from 0.1 nm to 2.0 nm, and the physical properties were measured for each case. In addition, cases in which the layer thicknesses d24 of the light-emitting elements of Example 1 and Example 2 were changed to 0 nm, or in other words, cases in which the first interlayer organic layer 24 was not formed in Example 1 and Example 2 were used as Comparative Example 1 and Comparative Example 2, and the physical properties of both were measured.

The physical properties of a case in which the layer thickness d24 of the light-emitting element according to Example 1 was changed, and the physical properties of the light-emitting element according to Comparative Example 1 are described in Table 2 below. The physical properties of a case in which the layer thickness d24 of the light-emitting element according to Example 2 was changed, and the physical properties of the light-emitting element according to Comparative Example 2 are described in Table 3 below.

TABLE 2

| d24(nm) | Voltage (V) | EQE(%) | Chromaticity (x, y) | Lifetime (h) |
|---|---|---|---|---|
| 0 (Comparative Example 1) | 4.2 | 13.3 | (0.140, 0.050) | 3200 |
| 0.3 | 4.2 | 13.2 | (0.140, 0.050) | 3700 |
| 0.5 | 4.2 | 13.1 | (0.140, 0.050) | 4200 |
| 1.0 | 4.3 | 13.0 | (0.140, 0.050) | 5500 |
| 1.5 | 4.5 | 12.6 | (0.140, 0.050) | 6800 |
| 2.0 | 4.9 | 12.0 | (0.140, 0.050) | 7000 |

TABLE 3

| d24(nm) | Voltage (V) | EQE(%) | Chromaticity (x, y) | Lifetime (h) |
|---|---|---|---|---|
| 0 (Comparative Example 2) | 4.0 | 12.9 | (0.136, 0.048) | 3700 |
| 0.1 | 4.0 | 12.8 | (0.136, 0.048) | 3800 |
| 0.3 | 4.2 | 12.8 | (0.137, 0.049) | 5000 |
| 0.5 | 4.3 | 12.7 | (0.136, 0.048) | 5700 |
| 1.0 | 4.4 | 12.6 | (0.136, 0.048) | 6600 |
| 1.5 | 4.7 | 12.2 | (0.137, 0.047) | 7200 |
| 2.0 | 5.1 | 11.7 | (0.137, 0.046) | 7300 |

In Table 2 and Table 3, the "d24" column indicates, in units of nm, the value of the layer thickness d24 of the first interlayer organic layer 24 of each light-emitting element. Here, in the "d24" column in Table 2, the row of 0 nm indicates the physical properties of the light-emitting element according to Comparative Example 1. Additionally, in the "d24" column in Table 3, the row of 0 nm indicates the physical properties of the light-emitting element according to Comparative Example 2.

In Table 2 and Table 3, the "voltage" column indicates, in units of V, the magnitude of the voltage required to generate a current with a current density of 10 $mA/cm^2$ between the electrodes of each light-emitting element. The "EQE" column indicates the percentage of external quantum efficiency of each light-emitting element under the application of the above voltage. In the "chromaticity" column, CIE chromaticity coordinates are used to indicate the chromaticity of the light emitted by each light-emitting element. The "lifetime" row indicates, in units of hours (h), the time period until the luminance of each light-emitting element reached 90 percent of the initial luminance at an environmental temperature of 25° C. and under the application of the above voltage.

As shown in Table 1 and Table 2, the lifetime of the light-emitting element according to Example 1, which was provided with the first interlayer organic layer 24, was improved over the lifetime of the light-emitting element according to Comparative Example 1, which did not include the first interlayer organic layer 24. Similarly, as shown in Table 1 and Table 3, the lifetime of the light-emitting element according to Example 2, which was provided with the first interlayer organic layer 24, was improved over the lifetime of the light-emitting element according to Comparative Example 2, which did not include the first interlayer organic layer 24. Also, as shown in Table 1, Table 2, and Table 3, the external quantum efficiency of each of the light-emitting elements according to Example 1 and Example 2 was not significantly reduced compared to the external quantum efficiency of each of the light-emitting elements according to Comparative Example 1 and Comparative Example 2.

Thus, in comparison to each of the light-emitting elements according to Comparative Example 1 and Comparative Example 2, the light-emitting elements according to each of Example 1 and Example 2 exhibited an improved lifetime while maintaining the external quantum efficiency.

Furthermore, as shown in Table 2 and Table 3, as the layer thickness d24 of the first interlayer organic layer 24 in the light-emitting element according to each example was increased, the lifetime of the light-emitting element tended to become longer. This is thought to be because as the thickness of the first interlayer organic layer 24 increased, the outward flow of electrons from the light-emitting layer 14B to the second hole transport layer 12B was reduced, and degradation of the second hole transport layer 12B was suppressed.

On the other hand, as the layer thickness d24 of the first interlayer organic layer 24 in the light-emitting element according to each of the examples was reduced, the external quantum efficiency of the light-emitting element tended to improve. This is thought to be because as the thickness of the first interlayer organic layer 24 was reduced, the efficiency of hole transport from the second hole transport layer 12B to the light-emitting layer 14B improved, and the efficiency of recombination of carriers in the light-emitting layer 14B was enhanced.

From the above, and from the perspective of significantly improving the lifetime while maintaining the external quantum efficiency, the layer thickness d24 of the first interlayer organic layer 24 of the light-emitting element according to each example is preferably from 0.3 nm to 1.5 nm.

Second Embodiment

Figure 6:
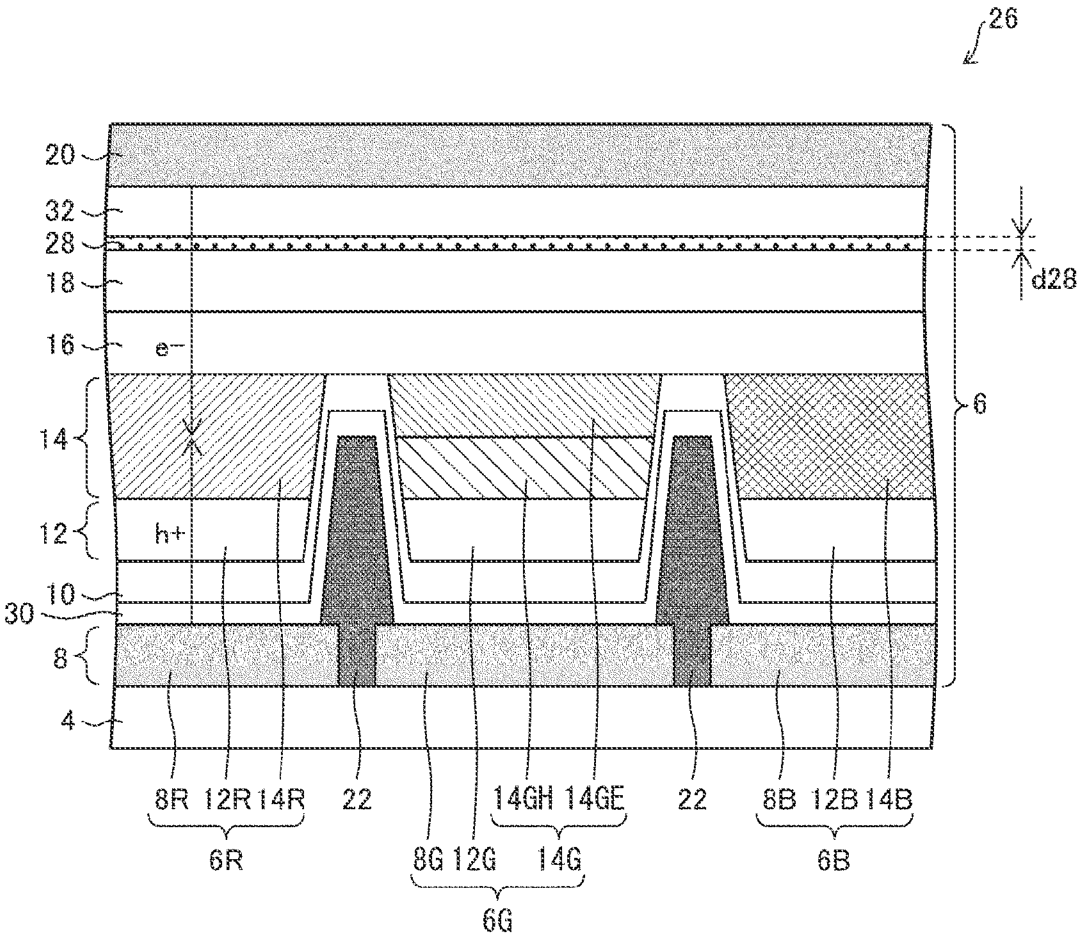
FIG. 6 is a schematic cross-sectional view of a display device according to a second embodiment of the disclosure.

FIG. 6 is a cross-sectional view of a display device 26 according to a second embodiment at a position corresponding to FIG. 1.

As illustrated in FIG. 6, in comparison to the display device 2 according to the previous embodiment, the display device 26 according to the present embodiment is provided with, between the second electron transport layer 18 and the cathode electrode 20, a second interlayer organic layer 28 in place of the first interlayer organic layer 24. In other words, the display device 26 according to the present embodiment is provided with the second interlayer organic layer 28 as the interlayer organic layer, and thereby has a configuration that differs from that of the display device 2 according to the previous embodiment.

Also, as illustrated in FIG. 6, the display device 26 according to the present embodiment is provided with a hole injection layer 30 between the anode electrode 8 and the first hole transport layer 10, and with an electron injection layer 32 between the second interlayer organic layer 28 and the cathode electrode 20. Furthermore, in the present embodiment, the second electron transport layer 18 includes an electron-accepting material and an organic material having electron transport properties, and includes, as the electron-accepting material, the lithium quinolate complex (Liq) described in the previous embodiment. However, in the present embodiment, the electron-transporting organic material included in the second electron transport layer 18 may be the same material as the electron-transporting organic material included in the second electron transport layer 18 of the previous embodiment.

With the exception of the abovementioned point, the display device 26 according to the present embodiment has the same configuration as that of the display device 2 according to the previous embodiment.

In the present embodiment, the second interlayer organic layer 28 is formed commonly for the light-emitting element 6B, the light-emitting element 6G, and the light-emitting element 6R. The second interlayer organic layer 28 is formed from an organic compound having an amino group or a hydroxyl group. In particular, the second interlayer organic layer 28 is formed from an isocyanurate compound having an amino group or a hydroxyl group. Specifically, the second interlayer organic layer 28 is formed from a compound represented by Chemical Formula (1) or Chemical Formula (2) below.

[Chem. 15]

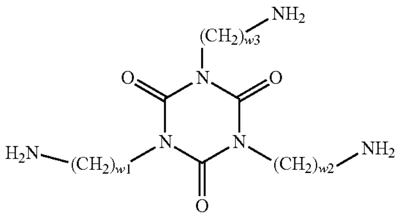

...(1)

[Chem. 16]

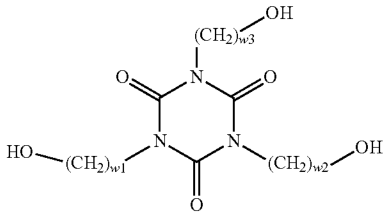

...(2)

Note that, as illustrated in FIG. 6, the second interlayer organic layer 28 has a layer thickness d28.

The hole injection layer 30 has a function of supporting the injection of positive holes from the anode electrode 8 into the first hole transport layer 10. For example, the value of the HOMO level of the hole injection layer 30 is a value between the HOMO level value of the anode electrode 8 and the HOMO level value of the first hole transport layer 10. Therefore, the efficiency of transport of positive holes from the anode electrode 8 to the light-emitting layer 14 is improved by the hole injection layer 30.

The electron injection layer 32 has a function of supporting the injection of electrons from the cathode electrode 20 into the second electron transport layer 18. For example, the value of the LUMO level of the electron injection layer 32 is a value between the LUMO level value of the cathode electrode 20 and the LUMO level value of the second electron transport layer 18. Thus, the efficiency of transport of electrons from the cathode electrode 20 to the light-emitting layer 14 is improved by the electron injection layer 32. Note that by forming the second interlayer organic layer 28 such that the layer thickness d28 is sufficiently thin, electron injection from the cathode electrode 20 to the second electron transport layer 18 through the electron injection layer 32 is achieved by electron tunneling of the second interlayer organic layer 28.

In the present embodiment, the light-emitting element layer 6 includes the hole injection layer 30 as a hole injection layer, the first hole transport layer 10 as a hole transport layer, and the second hole transport layer 12 as an electron blocking layer. Also, in the present embodiment, the light-emitting element layer 6 includes the electron injection layer 32 as an electron injection layer, the second electron transport layer 18 as an electron transport layer, and the first electron transport layer 16 as a hole blocking layer.

However, in the present embodiment, the light-emitting element layer 6 is not necessarily required to be provided with the hole injection layer 30, the second hole transport layer 12, the first electron transport layer 16, and the electron injection layer 32. In the present embodiment, the light-emitting element layer 6 may be provided with, between the anode electrode 8 and the cathode electrode 20 and in order from the anode electrode 8 side, the first hole transport layer 10 as a hole transport layer, the light-emitting layer 14, the second electron transport layer 18 as an electron transport layer, and the second interlayer organic layer 28 as an interlayer organic layer.

Here, in the lithium quinolate complex included in the second electron transport layer 18, electron exchange may occur within the molecule at high temperatures. The transfer of electrons within the molecule of the lithium quinolate complex occurs in accordance with the following chemical reaction.

[Chem. 17]

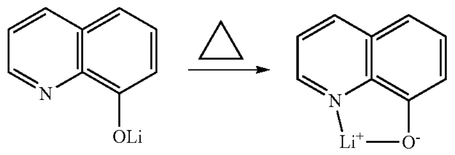

Specifically, the N atom of the heterocyclic ring of the lithium quinolate complex has an unpaired electron, and therefore at high temperatures, electron transfer occurs between the N atom and the Li atom, and ionization of the lithium quinolate complex proceeds. When the lithium quinolate complex is ionized, the effect of the lithium quinolate complex in stabilizing electron transport from the second electron transport layer 18 to the first electron transport layer 16 is reduced, electron excess occurs in the light-emitting layer 14, and the lifetime of the light-emitting element overall may be shortened.

However, in the present embodiment, as described above, the second interlayer organic layer 28 adjacent to the second electron transport layer 18 is formed from an organic compound having an amino group or a hydroxyl group. Therefore, hydrogen bonding occurs between the amino group or hydroxyl group of the second interlayer organic layer 28 and the N atom of the lithium quinolate complex of the second electron transport layer 18.

Specifically, the second interlayer organic layer 28 is formed from a compound having an amino group, the compound being represented by Chemical Formula (1) above. In this case, as illustrated by the dotted line in the following chemical formula, hydrogen bonding occurs between the amino group of the second interlayer organic layer 28 and the N atom of the lithium quinolate complex of the second electron transport layer 18.

[Chem. 18]

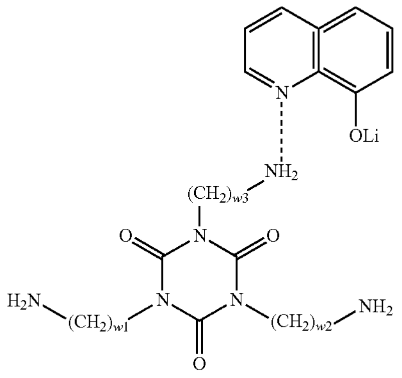

Through this, the N atoms having an unpaired electron in the lithium quinolate complex of the second electron transport layer 18 are reduced, and the stability of the lithium quinolate complex is improved. Therefore, even under high temperature, ionization of the lithium quinolate complex of the second electron transport layer 18 does not easily proceed. Thus, in the present embodiment, the effect of the lithium quinolate complex of the second electron transport layer 18 in stabilizing electron transport from the second electron transport layer 18 to the first electron transport layer 16 is maintained even at high temperatures, and the lifetime of the light-emitting elements overall is improved.

When the second interlayer organic layer 28 contains an isocyanurate compound, the above-described ionization of the lithium quinolate complex of the second electron transport layer 18 can be more efficiently suppressed. Furthermore, ionization of the lithium quinolate complex of the second electron transport layer 18 can be more efficiently suppressed by adopting a configuration in which the second interlayer organic layer 28 has a compound represented by Chemical Formula (1) or Chemical Formula (2) described above.

In addition, when the compound represented by Chemical Formula (1) or Chemical Formula (2) described above is used as a vapor deposition material, problems such as decomposition are unlikely to occur. Thus, a second interlayer organic layer 28 with suppressed degradation can be formed through vapor deposition by configuring the second interlayer organic layer 28 to have a compound represented by Chemical Formula (1) or Chemical Formula (2) described above.

The light-emitting element 6B, the light-emitting element 6G, and the light-emitting element 6R according to the present embodiment can more efficiently suppress degradation of the second electron transport layer 18 by having the second interlayer organic layer 28 as described above. This effect is particularly pronounced when each light-emitting element is placed in a high temperature environment. The display device 2 according to the present embodiment is provided with each of the light-emitting elements described above, and thus the lifetime of the display device 2 overall can be improved.

Light-emitting elements according to each of Examples 3 to 6 below were prepared with each light-emitting element having the same configuration as each light-emitting element of the display device 26 according to the present embodiment, and the physical properties were measured.

Example 3

A light-emitting element according to Example 3 was manufactured by the same technique as the light-emitting element according to Example 1 and had the same structure as the light-emitting element according to Example 1 with the exception that the second interlayer organic layer 28 was formed in place of the first interlayer organic layer 24, and the hole injection layer 30 was formed.

The hole injection layer 30 of the light-emitting element according to Example 1 was formed by forming, on the anode electrode 8, a film of an aromatic compound (HOMO: −7.83 eV, LUMO: −5.60 eV) serving as a hole injection material through low-temperature CVD of the hole injection material. Moreover, the second interlayer organic layer 28 was formed by vapor depositing an organic compound represented by Chemical Formula (1) above on the upper layer of the second electron transport layer 18.

Example 4

A light-emitting element according to Example 4 was manufactured by the same technique as the light-emitting element according to Example 3 and had the same structure as the light-emitting element according to Example 3 with the exception that the material of the second interlayer organic layer 28 was excluded. The second interlayer organic layer 28 of the light-emitting element according to Example 4 was formed by vapor depositing an organic compound represented by Chemical Formula (2) above on the upper layer of the second electron transport layer 18.

Example 5

A light-emitting element according to Example 5 was prepared with the same structure as the light-emitting element 6G according to the present embodiment. The light-emitting element according to Example 5 was manufactured by the same technique as the light-emitting element according to Example 3 and had the same structure as the light-emitting element according to Example 3 with the exception that the light-emitting layer 14G was provided in place of the light-emitting layer 14B.

The light-emitting layer 14G of the light-emitting element according to Example 5 was formed by sequentially forming a first light-emitting layer 14GH and a second light-emitting layer 14GE on the upper layer of the second hole transport layer 12G. The light-emitting layer 14G was formed by co-evaporation of three materials including a rubrene-based compound (HOMO: −5.60 eV, LUMO: −2.34 eV) serving as a hole transport material, Alq3 (tris(8-hydroxyquinolinato) aluminum) (HOMO: −5.96 eV, LUMO: −2.84 eV) serving as an electron-transporting material, and an iridium complex (HOMO: −5.60 eV, LUMO: −2.90 eV) serving as a phosphorescence emission dopant.

Example 6

A light-emitting element according to Example 6 was prepared with the same structure as the light-emitting element 6R according to the present embodiment. In addition, the light-emitting element according to the present example was manufactured by the same technique as the light-emitting element according to Example 3 and had the same structure as the light-emitting element according to Example 3 with the exception that the light-emitting layer 14R was provided in place of the light-emitting layer 14B.

The light-emitting layer 14R of the light-emitting element according to the present example was formed by co-evaporation of a host material (HOMO: −5.72 eV, LUMO: −2.64 eV) and an iridium complex (HOMO: −4.85 eV, LUMO: −2.90 eV) serving as a phosphorescence emission dopant, onto an upper layer of the second hole transport layer 12R.

Furthermore, light-emitting elements according to Comparative Examples 3 to 6 were prepared in relation to each of the light-emitting elements of Examples 3 to 6, and the physical properties were measured. The light-emitting elements according to each of Comparative Examples 3 to 6 were prepared with the same configurations as the light-emitting elements according to each of Examples 3 to 6 with the exception that the second interlayer organic layer 28 was not formed.

Next, the physical properties of the light-emitting elements according to the examples and the comparative examples described above were measured, and the physical properties thereof were compared. Here, the physical properties of the light-emitting elements according to each of Examples 3 to 6 were measured for a case in which the layer thickness d28 of the second interlayer organic layer 28 was changed. The layer thickness d28 of the light-emitting element according to each of the examples was changed from 0.1 nm to 4 nm, and the physical properties were measured. In addition, cases in which the layer thicknesses d28 of the light-emitting elements of each of Examples 3 to 6 were changed to 0 nm, or in other words, cases in which the second interlayer organic layer 28 was not formed in Examples 3 to 6, were used as Comparative Examples 3 to 6, and the physical properties were measured.

The physical properties of the light-emitting elements according to each of Examples 3 to 6 when the layer thickness d28 was changed are shown in each of Tables 4 to 7 below. Note that in each of Tables 4 to 7, the physical properties of the light-emitting elements according to each of Comparative Examples 3 to 6 are also described.

TABLE 4

| d28(nm) | EQE(%) | Chromaticity (x, y) | Normal Temperature Lifetime (h) | High Temperature Lifetime (h) |
|---|---|---|---|---|
| 0 (Comparative Example 3) | 13.3 | (0.14, 0.05) | 754 | 114 |
| 0.1 | 13.4 | (0.14, 0.05) | 835 | 143 |
| 0.3 | 13.4 | (0.14, 0.05) | 890 | 155 |
| 0.5 | 13.5 | (0.14, 0.05) | 895 | 152 |
| 1.0 | 13.3 | (0.14, 0.05) | 913 | 157 |
| 2.0 | 13.1 | (0.14, 0.05) | 905 | 154 |
| 3.0 | 12.8 | (0.14, 0.05) | 900 | 154 |
| 4.0 | 12.4 | (0.14, 0.05) | 900 | 155 |

TABLE 5

| d28(nm) | EQE(%) | Chromaticity (x, y) | Normal Temperature Lifetime (h) | High Temperature Lifetime (h) |
|---|---|---|---|---|
| 0 (Comparative Example 4) | 13.3 | (0.14, 0.05) | 770 | 114 |
| 0.1 | 13.2 | (0.14, 0.05) | 810 | 140 |
| 0.3 | 13.2 | (0.14, 0.05) | 875 | 151 |
| 0.5 | 13.3 | (0.14, 0.05) | 870 | 151 |
| 1.0 | 13.3 | (0.14, 0.05) | 875 | 154 |

TABLE 5-continued

| d28(nm) | EQE(%) | Chromaticity (x, y) | Normal Temperature Lifetime (h) | High Temperature Lifetime (h) |
|---|---|---|---|---|
| 2.0 | 13.3 | (0.14, 0.05) | 880 | 153 |
| 3.0 | 13.0 | (0.14, 0.05) | 875 | 154 |
| 4.0 | 12.7 | (0.14, 0.05) | 875 | 153 |

TABLE 6

| d28(nm) | EQE(%) | Chromaticity (x, y) | Normal Temperature Lifetime (h) | High Temperature Lifetime (h) |
|---|---|---|---|---|
| 0 (Comparative Example 5) | 30.3 | (0.24, 0.72) | 853 | 95 |
| 0.1 | 30.3 | (0.24, 0.71) | 904 | 108 |
| 0.3 | 30.2 | (0.24, 0.72) | 912 | 110 |
| 0.5 | 30.3 | (0.24, 0.71) | 910 | 108 |
| 1.0 | 30.4 | (0.24, 0.71) | 910 | 109 |
| 2.0 | 30.1 | (0.24, 0.71) | 908 | 111 |
| 3.0 | 30.0 | (0.24, 0.71) | 908 | 109 |
| 4.0 | 27.5 | (0.24, 0.71) | 910 | 111 |

TABLE 7

| d28(nm) | EQE(%) | Chromaticity (x, y) | Normal Temperature Lifetime (h) | High Temperature Lifetime (h) |
|---|---|---|---|---|
| 0 (Comparative Example 6) | 34.5 | (0.70, 0.31) | 2150 | 334 |
| 0.1 | 34.8 | (0.70, 0.31) | 2880 | 360 |
| 0.3 | 34.3 | (0.71, 0.31) | 2950 | 370 |
| 0.5 | 34.4 | (0.71, 0.31) | 3030 | 373 |
| 1.0 | 34.4 | (0.70, 0.31) | 2980 | 370 |
| 2.0 | 34.6 | (0.70, 0.31) | 2970 | 370 |
| 3.0 | 33.7 | (0.71, 0.31) | 3010 | 372 |
| 4.0 | 32.0 | (0.70, 0.31) | 3050 | 375 |

In Tables 4 and 7, the "EQE" column indicates the percentage of external quantum efficiency of each light-emitting element under the application of the above voltage. In the "chromaticity" column, CIE chromaticity coordinates are used to indicate the chromaticity of the light emitted by each light-emitting element. The "normal temperature lifetime" column indicates, in units of hours (h), the time period until the luminance of each light-emitting element reached 90 percent of the initial luminance at an environmental temperature of 25° C. and under the application of the above voltage. The "high temperature lifetime" column indicates, in units of hours (h), the time period until the luminance of each light-emitting element reached 90 percent of the initial luminance at an environmental temperature of 70° C. and under the application of the above voltage.

As shown in Table 4 to Table 7, the lifetime in a normal temperature environment and the lifetime in a high temperature environment of each of the light-emitting elements according to Examples 3 to 6 were improved in comparison to the lifetimes in normal temperature and high temperature environments of each of the light-emitting elements according to Comparative Examples 3 to 6. Moreover, the lifetime improvement of each of the light-emitting elements according to Examples 3 to 6 was more pronounced in the high-temperature environment.

Furthermore, as shown in Table 4 to Table 7, as the layer thickness d28 of the second interlayer organic layer 28 was increased in the light-emitting elements according to each of the examples, the lifetime of the light-emitting elements tended to become longer. This is thought to be because as the second interlayer organic layer 28 became thicker, the progression of ionization of the lithium quinolate complex of the second electron transport layer 18 was more efficiently suppressed, and degradation of the second electron transport layer 18 was suppressed.

On the other hand, as shown in Table 4 to Table 7, the external quantum efficiency of the light-emitting elements according to each of Examples 3 to 6 was not significantly reduced when the layer thickness d28 of the second interlayer organic layer 28 was 3 nm or less. This is thought to be because in the injection of electrons from the electron injection layer 32 into the second electron transport layer 18, electron tunneling of the second interlayer organic layer 28 occurs efficiently due to the second interlayer organic layer 28 being sufficiently thin.

From the above, and from the perspective of significantly improving the lifetime while maintaining the external quantum efficiency, the layer thickness d28 of the second interlayer organic layer 28 of the light-emitting element according to each example is preferably from 0.1 nm to 3 nm.

A display device 26 having higher luminous efficiency and an improved lifetime can be obtained by providing the display device 26 with the light-emitting element 6R, the light-emitting element 6G, and the light-emitting element 6B according to the present embodiment.

Note that in each of the embodiments described above, configurations in which the light-emitting element 6R was provided with a single light-emitting layer 14R were described, but no such limitation is intended. For example, the light-emitting element 6R may be provided with a light-emitting layer 14R in which a red light-emitting layer of a type having hole transport properties and a red light-emitting layer of a type having electron transport properties are layered, similar to the light-emitting layer 14G of the light-emitting element 6G.

The disclosure is not limited to each of the embodiments described above, and various modifications may be made within the scope of the claims. Embodiments obtained by appropriately combining technical approaches disclosed in each of the different embodiments also fall within the technical scope of the disclosure.

Furthermore, novel technical features can be formed by combining the technical approaches disclosed in each of the embodiments.

The invention claimed is:

1. A light-emitting element comprising:

an anode electrode;

a cathode electrode; and between the anode electrode and the cathode electrode, in this order, from the anode electrode:

a hole transport layer;

a light-emitting layer;

an electron transport layer; and an interlayer organic layer, wherein:

the electron transport layer includes a lithium quinolate complex and a first organic compound having electron transport properties, and the interlayer organic layer includes a second organic compound including an amino group or a hydroxyl group, and the interlayer organic layer further includes an isocyanurate compound including an amino group or a hydroxyl group.

2. The light-emitting element according to claim 1, further comprising:

a hole injection layer between the anode electrode and the hole transport layer;

an electron blocking layer between the hole transport layer and the light-emitting layer;

a hole blocking layer between the light-emitting layer and the electron transport layer; and an electron injection layer between the interlayer organic layer and the cathode electrode.

3. A display device, comprising:

one or more light-emitting elements including the light-emitting element of claim 1.

* * * * *